United States Patent [19]

Yamashita

[11] Patent Number: 4,620,312
[45] Date of Patent: Oct. 28, 1986

[54] PULSE SIGNAL PROCESSING CIRCUIT
[75] Inventor: Noriyuki Yamashita, Tokyo, Japan
[73] Assignee: Sony Corporation, Tokyo, Japan
[21] Appl. No.: 804,238
[22] Filed: Dec. 3, 1985

Related U.S. Application Data

[63] Continuation of Ser. No. 515,187, Jul. 19, 1983, abandoned.

[30] Foreign Application Priority Data

Jul. 20, 1982 [JP] Japan .................. 57-125985

[51] Int. Cl.$^4$ .................................. H03K 3/033
[52] U.S. Cl. .................................. 375/22; 375/104;
455/223; 358/33; 307/265; 307/273; 307/603
[58] Field of Search ............... 375/22, 76, 99, 104;
358/33, 36, 155, 167; 455/223, 224; 307/265,
267, 273, 275, 603; 329/106

[56] References Cited

U.S. PATENT DOCUMENTS

| | | | |
|---|---|---|---|
| 3,588,543 | 6/1971 | Schwartz | 307/265 |
| 3,711,729 | 1/1973 | Quiogue | 307/265 |
| 3,725,681 | 4/1973 | Frederiksen | 307/265 |
| 3,735,154 | 5/1973 | Meeker et al. | 307/273 |
| 3,742,257 | 6/1973 | Wittenzellner | 307/265 |
| 3,952,213 | 4/1976 | Fukaya | 307/265 |

FOREIGN PATENT DOCUMENTS 1533093 1/1977 United Kingdom .
1543203 3/1979 United Kingdom .
2065407 6/1981 United Kingdom .

Primary Examiner—Robert L. Griffin
Assistant Examiner—Raymond C. Glenny
Attorney, Agent, or Firm—Lewis H. Eslinger; Alvin Sinderbrand

[57] ABSTRACT

A pulse signal processing circuit includes a NAND circuit that accepts periodic input pulses and an upper-limit detection signal from an upper limit detector and, when both an input pulse and the upper-limit detection signal are present, provides a setting signal to a flip-flop. When the flip-flop is set, it provides a discharging signal to activate a constant discharging current source. A capacitor is discharged by the discharging current source until the potential across the capacitor reaches a lower reference potential, when a lower-limit detection signal from a lower limit detector resets the flip-flop to terminate the discharging signal. The discharging signal also comprises the output pulse of the processing circuit. Resetting the flip-flop initiates a charging signal to activate a constant charging current source to charge the capacitor until it reaches an upper reference potential, when the upper-limit detection signal is provided to the NAND circuit to condition it to receive the next input pulse. Meanwhile, until the upper-limit detection signal is initiated, noise on the input line cannot provide an output pulse because that noise will not provide the setting signal from the NAND circuit to initiate the discharging signal.

8 Claims, 14 Drawing Figures

PRIOR ART
FIG. 2A
FIG. 2B
FIG. 2C
FIG. 2D
FIG. 2E
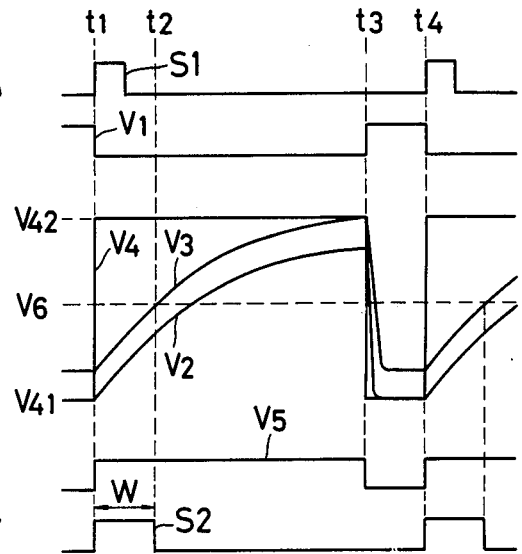
FIG. 3
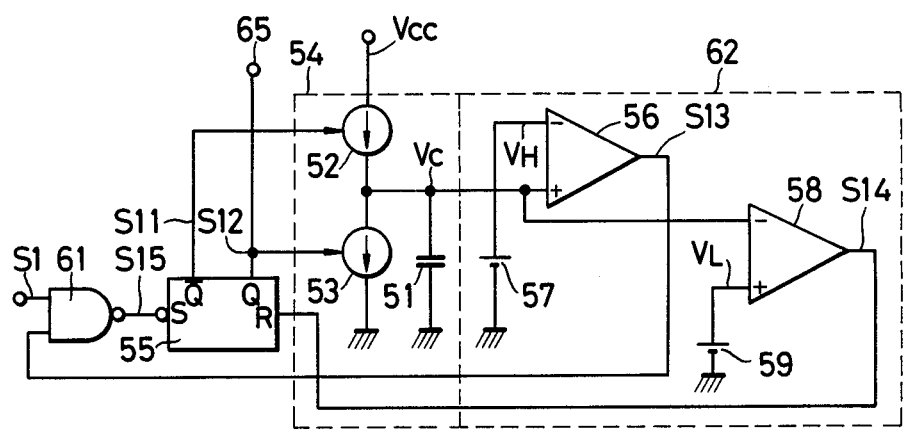

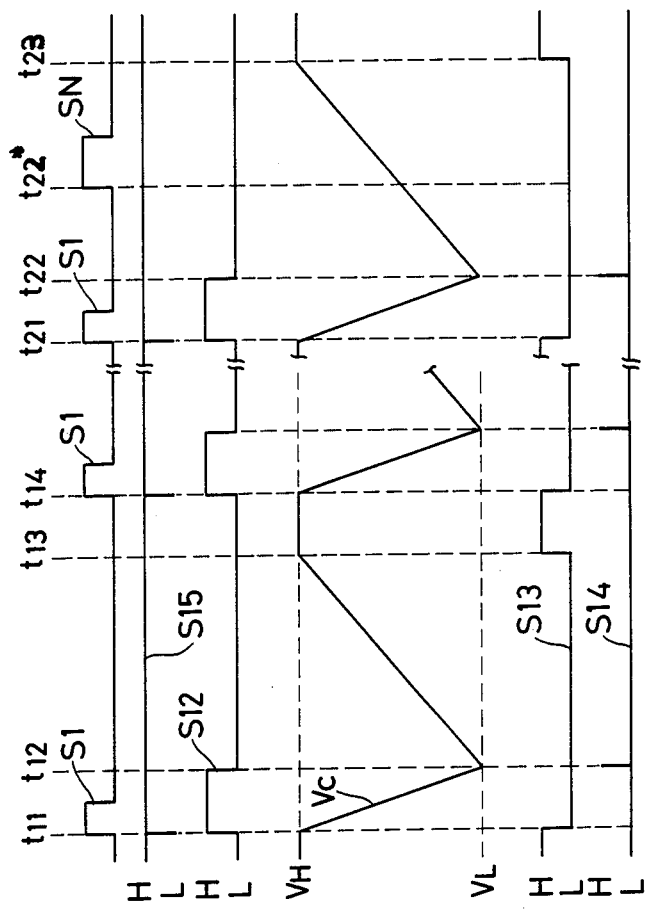

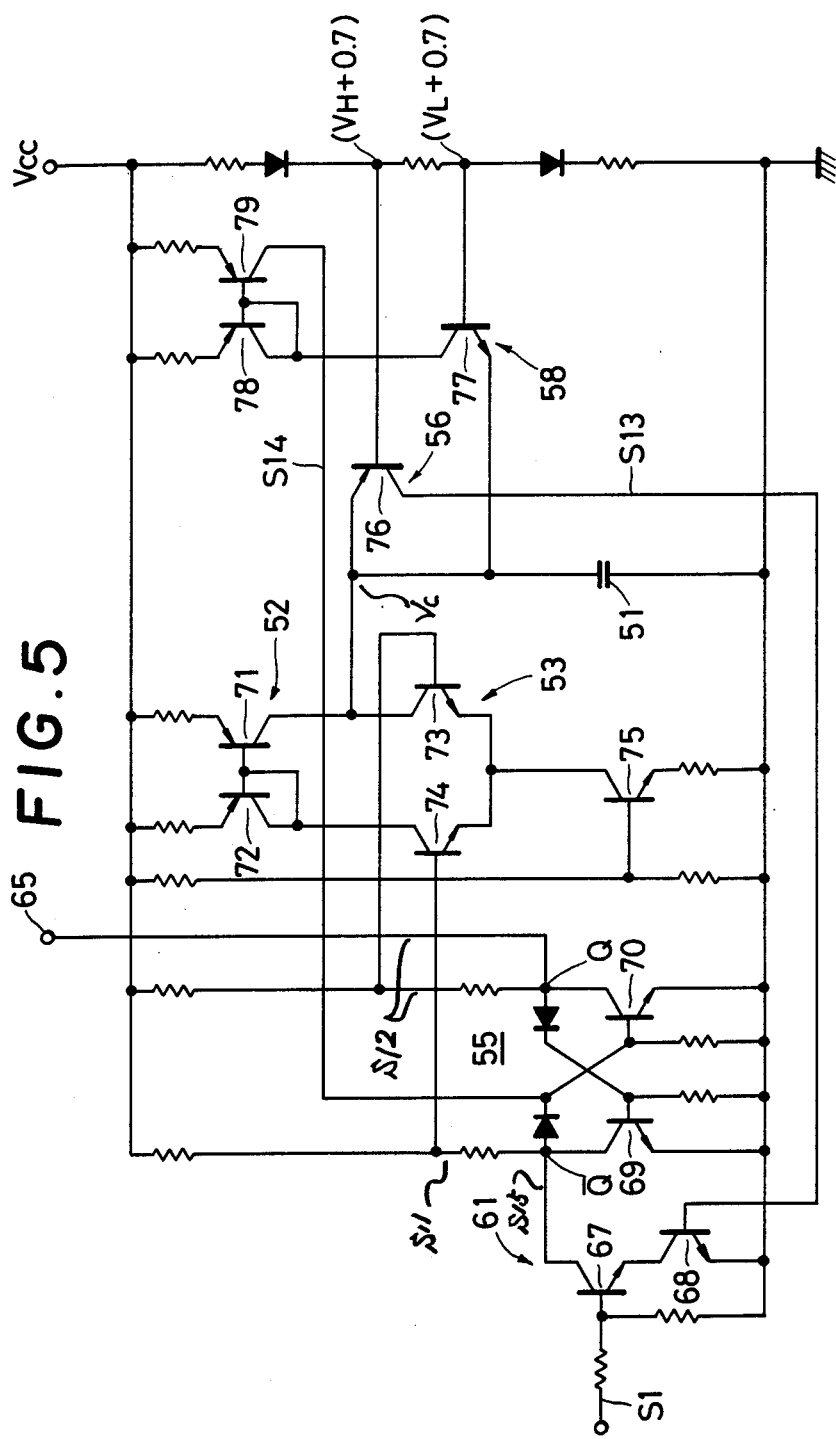

PULSE SIGNAL PROCESSING CIRCUIT

This is a continuation of application Ser. No. 06/515,187 filed July 19, 1983, now abandoned.

BACKGROUND OF THE INVENTION

1. Field of the Invention

The present invention relates to a pulse width processing circuit and, more particularly, to such a circuit for providing an output pulse with a precisely controlled width.

2. Description of the Prior Art

Pulse width processing circuits provide timing pulses for television receivers or video tape recorders (VTR's). Such processing circuits can accept pulses, like the horizontal synchronizing pulses in a composite video signal, and provide more precise timing pulses in response. Processing circuits are used to provide timing pulses, instead of using the horizontal synchronizing pulses directly, because the width of the synchronizing pulses is often not precise enough for use by the receiver or VTR. And since composite video signals can contain noise that might be interpreted as a timing pulse by the receiver or VTR, pulse width processing circuits also provide timing pulses only in response to the synchronizing signals and thus prevent the receiver or VTR from reacting to noise. In short, pulse width processing circuits are used to provide precision-width timing pulses for a receiver or VTR in response to horizontal synchronizing pulses in a composite video signal and to prevent any noise in the video signal from being interpreted by the receiver or VTR as a timing pulse.

However, the precision of the width of the timing pulses provided by known prior art processing circuits is limited because of their principle of operation. As is explained in more detail below, prior art circuits rely on the precision to which a small reference voltage can be set and, in practice, a sufficiently precise reference voltage has proved difficult to achieve.

SUMMARY OF THE INVENTION

It is an object of the present invention to overcome the aforesaid disadvantages of prior art pulse width processing circuits.

It is another object of the present invention to provide a pulse width processing circuit which can provide an extremely precise output pulse width and can be used for effectively masking noise in the input signal.

In accordance with an aspect of the present invention, a pulse width processing circuit comprises a control means for providing a control signal having a first state in response to an input pulse and a second state in response to a detection signal, an indicating means for providing in response to the control signal at the first state a variable-level indicating signal, and detecting means for detecting the level of the indicating signal and providing the detection signal when the indicating signal reaches a predetermined level, whereby the duration of the states of the control signal determines the duration of an output pulse.

The above and other objects, features and advantages of the present invention will be apparent when the following detailed description of a preferred embodiment of the invention is considered in connection with the drawings.

BRIEF DESCRIPTION OF THE DRAWINGS

FIGS. 2A-2E illustrate the waveforms of various signals produced by the circuit shown in FIG. 1.

FIG. 3 is a schematic block diagram of an embodiment of a pulse width processing circuit in accordance with the present invention.

FIG. 4A-4F illustrate the waveforms of various signals produced by the pulse width processing circuit shown in FIG. 3.

FIG. 5 is a circuit diagram of the pulse width processing circuit shown in FIG. 3.

DETAILED DESCRIPTION OF A PREFERRED EMBODIMENT

Figure 1:
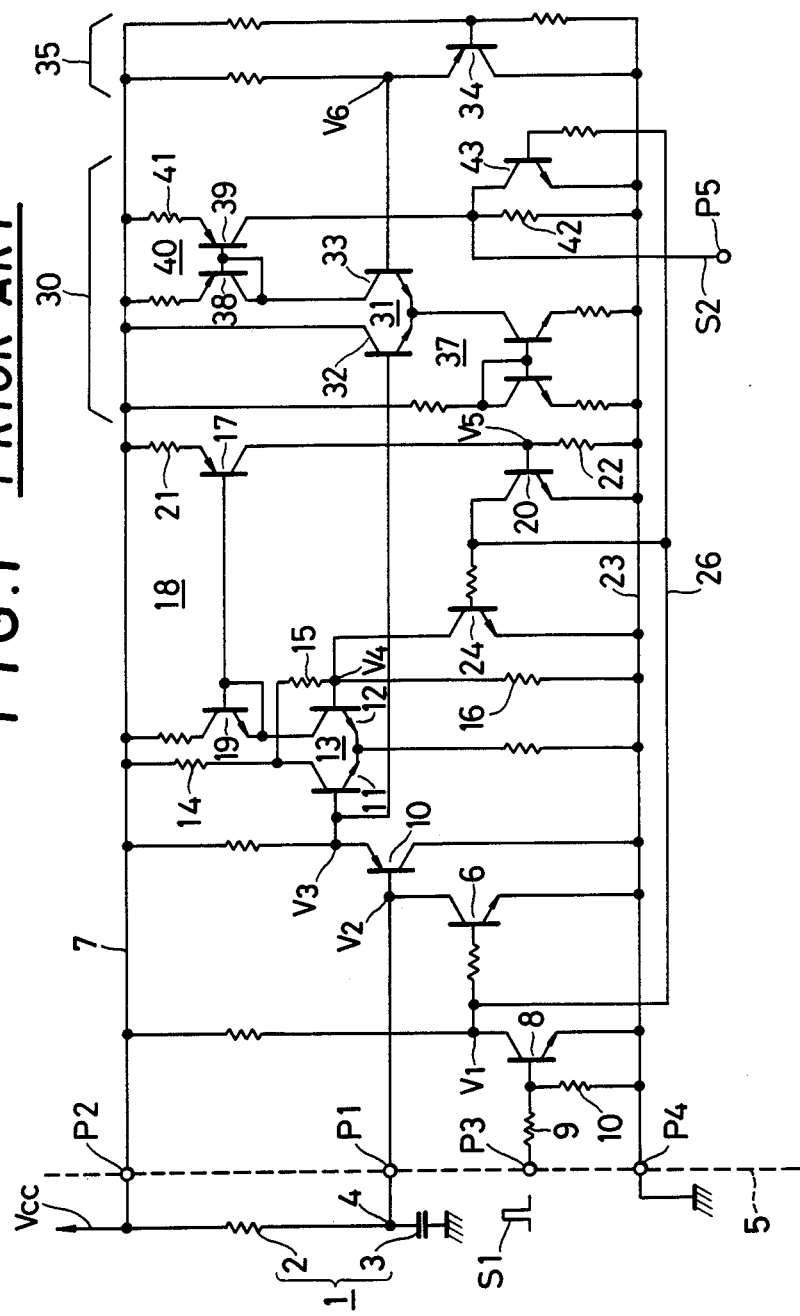
FIG. 1 is a circuit diagram of a prior art pulse width processing circuit.

The advantages of the pulse width processing circuit of the present invention can be better appreciated by first considering the operation of a prior art pulse width processing circuit.

FIG. 1 shows such a prior art circuit with a charge-discharge circuit 1 comprising a charging resistor 2 and a charging capacitor 3 connected in series between a power supply $V_{cc}$ and ground. A typical voltage provided by the power supply $V_{cc}$ is 6.5 volts. The node 4 between the resistor 2 and the capacitor 3 is connected to an integrated circuit (IC) 5 by a capacitor-connecting pin P1. The IC 5 has formed thereon a discharging transistor 6 having its collector connected to the node 4. Generally, all of the circuit elements shown to the right of the dotted line in FIG. 1 are formed on the IC 5, and connections thereto are made through the pins P1-P5 in a conventional manner. The pin P2 connects the power supply $V_{cc}$ to a power supply line 7 of the IC 5; the pin P3 connects an input line to the base of an input transistor 8 through an input resistor 9; the pin P4 connects the base of the transistor 8 to ground through another input resistor 10; and the pin P5 provides an output pulse S2.

The voltage $V_1$ is present at the collector of the input transistor 8. When the input transistor 8 is off, the voltage $V_1$ is at a given level. As shown in FIGS. 2A and 2B, the voltage $V_1$ goes to a lower level when an input pulse S1 is applied to the base of the input transistor 8 because the collector of the transistor 8 is connected to ground. When that happens, the discharging transistor 6 is turned off and the voltage $V_2$ across the charging capacitor 3 begins to rise as the capacitor 3 charges. The value of the voltage $V_2$ is plotted against time in FIG. 2C The shape of the curve depends, of course, on the capacitance and resistance of the capacitor 3 and resistor 2.

The voltage $V_2$ is applied to the base of a buffer transistor 10. The voltage $V_3$ at the emitter of the buffer transistor 10 is maintained higher than the voltage $V_2$ by virtue of the base-emitter voltage of the buffer transistor 10. FIG. 2C also shows the relationship between $V_2$ and $V_3$.

The base of a comparing transistor 11 is connected to the emitter of the buffer transistor 10 and thus the voltage $V_3$ appears at the base of the comparing transistor. The comparing transistor 11 and a reference transistor 12 comprise an input Schmitt circuit 13. The base of the reference transistor 12 receives a reference voltage $V_4$, provided by the power supply $V_{cc}$ and the resistors 14, 15 and 16. When $V_3$ is less than $V_4$, the comparing transistor 11 is on and the reference transistor 12 is off.

When $V_3$ is greater than $V_4$, the comparing transistor 11 is off and the reference transistor 12 is on.

A transistor 17 forms a current mirror circuit 18 with a transistor 19. The transistor 19 forms a part of the lead circuit for the reference transistor 12. The collector of the transistor 17 is connected to the base of a transistor 20. The emitter of the transistor 17 is connected to the power supply $V_{cc}$ through a resistor 21, while the collector is connected to ground through a resistor 22 and a common ground line 23 of the IC 5. A shorting transistor 24 connects the common ground line 23 to the base of the reference transistor 12 in parallel with the resistor 16. The collector of the transistor 20 is connected to the base of the shorting transistor 24, while the emitter is connected to the common ground line 23. The base of the shorting transistor 24 is also connected to the collector of the input transistor 8 through line 26.

At time $t=t_1$, when an input pulse S1 is received, the voltage $V_1$ drops to a lower level (see FIG. 2B) and the shorting transistor 24 is turned off. The voltage $V_4$ thus rises from a lower level $V_{41}$ of, say, 0 volts, to a higher level $V_{42}$ of, say, 4 volts, as shown in FIG. 2C. Simultaneously, the voltages $V_2$ and $V_3$ begin to rise as also shown in FIG. 2C. The comparing transistor 11 is on and the reference transistor 12 is off. The current mirror 18 is turned on so that the transistor 17 is on and the voltage $V_5$ at the base of the transistor 20 assumes a higher level, as shown in FIG. 2D. When the value of $V_3$ reaches $V_{42}$, at time $t=t_3$, the comparing transistor 11 is turned off and the reference transistor 12 is turned on. The current mirror 18 is turned off and the voltage $V_5$ thus drops to its lower level, as shown in FIG. 2D.

Meanwhile, the input pulse S1 has terminated and the input transistor 8 is switched off. However, $V_1$ stays at its lower level, and the shorting transistor 24 stays off, because the line 26 is connected to ground through the transistor 20, which is kept on until $V_5$ drops to its lower level at $t=t_3$.

When the voltage $V_5$ drops at $t=t_3$, the transistor 20 is switched off. The voltage $V_1$ rises and turns on the shorting transistor 24, which causes the voltage $V_4$ to fall to $V_{41}$, and turns on the discharging transistor 6, which causes $V_2$ to fall to its lower level. The voltage $V_3$, which follows the voltage $V_2$, also falls to its lower level. The values of the voltages $V_1$, $V_2$, $V_3$, $V_4$ and $V_5$ at the times $t=t_1$ and $t=t_3$ are shown in FIGS. 2B, 2C and 2D. Note that the discharging transistor 6 cannot be turned on until $t=t_3$ because it is kept off by its connection to ground through the line 26 and transistor 20. Thus, any noise in the input line before $t=t_3$ cannot affect the discharging transistor 6 and is thus "masked".

The IC 5 also has formed on it an output pulse detection circuit 30. The detection circuit 30 comprises an output Schmitt circuit 31, which includes a comparing transistor 32 and a reference transistor 33. A transistor 34 is connected as shown in FIG. 1 to form a temperature-compensated reference voltage source 35 that supplies a reference voltage $V_6$ to the base of the output reference transistor 33. The reference voltage $V_6$ is chosen to provide an output pulse S2 having a desired width, as is described in detail below. In this example the reference voltage $V_6$ is 1.625 volts.

The precision of the output pulse width is increased by incorporating a constant current source 37 into the output pulse detection circuit 30. Two transistors 38 and 39 are connected into an output current mirror 40 to provide a load circuit for the reference transistor 33. Two resistors 41 and 42 are connected in series with the transistor 39. An output transistor 43 is connected in parallel with the resistor 42. The base of the output transistor 43 is connected by the line 26 to the collector of the input transistor 8 so that the voltage $V_1$ is applied to the base of the output transistor 43. An output line is connected to the node between the resistors 41 and 42 and leads to the pin P5.

Before time $t=t_1$, the reference transistor 33 is turned on and the output current mirror 40 is turned on. The voltage $V_1$ is at its higher level so that the output transistor 43 is turned on and the output line is at its lower level, as shown in FIG. 2E, because it it is connected to ground. When $t=t_1$, $V_1$ goes to its lower level, the output transistor 43 is turned off and the output pulse S2 is initiated, the level of which depends on the divided voltage provided by the resistors 41 and 42. When the voltage $V_3$ reaches the reference voltage $V_6$, at time $t=t_2$, the transistor 33 and the current mirror 40 are switched off, which returns the output line to ground and terminates the output pulse S2. The width W of the output pulse S2 is thus set by the reference voltage $V_6$, as shown in FIGS. 2C and 2E.

The pulse width processing circuit in FIG. 1 provides an output pulse S2 which begins when an input pulse S1 is received. The receipt of the input pulse S1 begins the charging of a discharged capacitor. At a time $t_2$, the charge on the capacitor reaches a predetermined reference voltage. In addition, any noise in the input line is masked by preventing discharge of the charging capacitor until a time $t_3$ close to the expected occurrence of the next input pulse.

However, in the prior art circuit of FIG. 1, the masking period ($t_2$ to $t_3$) and the output pulse width W are both determined by the voltage across the capacitor as it is charging. That is, the output pulse width is determined by the time it takes for the charging capacitor to reach an intermediate voltage and the masking period is determined by the time it takes to reach a maximum voltage. The time required to reach the maximum voltage must therefore necessarily be less than the time between successive input pulses. When the difference between the minimum and maximum voltages across the capacitor ($V_{42}-V_{41}$ in the above circuit) is small compared to the reference voltage ($V_6$ in the above circuit), the precision of the width W of the output pulse S2 suffers because of the inevitable irregularities of the properties of the elements used to construct the circuit. In the above described prior art circuit, in which $V_{42}-V_{41}=4$ volts and $V_6=1.625$ volts, which are typical examples, the width W can in fact vary beyond acceptable limits. While some precision can be gained by increasing those voltages, such an increase may not be practical.

An illustrative embodiment of a pulse width processing circuit that overcomes those disadvantages is shown in FIG. 3. A capacitor 51 is connected at one end to ground and at the other end to a point between a constant charging current source 52 and a constant discharging current source 53. Together the capacitor 51 and the current sources 52 and 53 comprise an indicating means 54 that provides a variable-level indicating signal $V_C$, here the potential across the capacitor 51. The current sources 52 and 53 are connected in series between a power supply $V_{cc}$, which is connected to the current source 52, and ground, to which the current source 53 is connected. A switching circuit comprising a flip-flop 55 provides a charging signal S11 for activating the charging current source 52 and a discharging signal S12 for activating the discharging current source 53.

The indicating signal $V_C$ is supplied to the non-inverting input of an amplifier comprising an upper limit detector 56. A power source 57 provides an upper reference voltage $V_H$ to the inverting input of the amplifier 56. The upper limit detector 56 provides an upper-limit detection signal S13 to the reset terminal R of the flip-flop 55. The signal S13 is provided when $V_C$ exceeds $V_H$. The upper limit detector 56 also prevents $V_C$ from going above $V_H$ by more than a very small amount, in effect preventing the potential across the capacitor from exceeding the upper reference potential.

The indicating signal $V_C$ is also supplied to the inverting input of an amplifier comprising a lower limit detector 58. A power source 59 provides a lower reference voltage to the non-inverting input of the amplifier 58. The lower limit detector 58 provides a lower-limit detection signal S14 to a NAND circuit 61. The signal S14 is provided when $V_C$ is less than $V_L$.

Generally, the amplifiers 56 and 58 and power sources 57 and 59 comprise a detecting means 62 that provide a detection signal, here the signals S13 and S14, in response to the variable-level indicating signal.

A NAND circuit 61 has two input terminals and provides an output S15. One input terminal accepts the upper-limit detection signal S13 and the other accepts an input pulse S1. When both the input pulse and the upperlimit detection signal S13 are present, the output S15 is at a low level and comprises a setting signal for the flip-flop 55; otherwise, S15 is at a high level. The output S15 is provided to a set terminal S of the flip-flop 55.

The flip-flop 55 has two output terminals, $\overline{Q}$ and Q. The terminal $\overline{Q}$ provides the charging signal S11 and the terminal Q provides the discharging signal S12. The discharging signal S12 also comprises an output pulse applied to an output terminal 65. The flip-flop 55 also has a reset terminal R to which the lower-limit detection signal S14 is applied.

The flip-flop 55 and the NAND circuit 61 comprise a control means that receives the input signal and the detection signal and provides a control signal, here the signals S11 and S12, that has two states. The first state, provided in response to an input pulse, supplies the discharging signal. The second state, provided in response to the detection signal, supplies the charging signal.

The operation of the circuit shown in FIG. 3 is illustrated in FIGS. 4A–4F. Assume that before time $t=t_{11}$, the flip-flop 55 has been reset, in other words, that the lower-limit detection signal S14 has been provided at some previous time. When the flip-flop 55 was reset, the $\overline{Q}$ output is at a high level. Thus, assume that the capacitor 51 has been charged by the charging signal S11 to the upper reference voltage. The output pulse is not present because the discharging signal is not present. Since $V_C$ has exceeded $V_H$, the upper-limit detection signal S13 is present.

When the input pulse S1 is received by the NAND circuit 61 at $t=t_{11}$, the NAND output S15 goes to a low level, as shown in FIGS. 4A and 4B, thus providing a setting signal to the flip-flop 55. The terminal $\overline{Q}$ output goes to a low level, thus terminating the charging signal S11 and de-activating the charging current source 52. The terminal Q output goes to a high level, as shown in FIG. 4C, thus initiating the discharging signal S12 and activating the discharging current source 53. The capacitor 51 begins to discharge, causing the indicating signal $V_C$ to begin dropping, as shown by FIG. 4D. The output pulse also begins because the discharging signal S12 is also the output pulse. As soon as $V_C$ begins to drop, the upper-limit detecting signal S13 is terminated, as shown in FIG. 4E, because $V_c$ is kept just above the upper reference voltage $V_H$. Thus, just after the capacitor 51 begins to discharge at $t=t_{11}$, the NAND output S15 thus returns to a high level and will stay there, as shown in FIG. 4B, regardless of the level of the input signal. The absence of the upper-limit detection signal S13 thus effectively "masks" noise in the input line, preventing such noise from affecting the operation of the circuit, as is explained in more detail below.

In any case, the indicating signal $V_C$ continues to drop until it falls just below the lower reference voltage $V_L$ at time $t=t_{12}$. At that point the lower-limit detection signal S14 is provided, as shown in FIG. 4F. The lower-limit detection signal resets the flip-flop 55, so that the Q terminal goes to a lower-level and the discharging signal S12 is terminated. Thus, the output pulse is terminated at time $t=t_{12}$, as shown in FIG. 4C. The $\overline{Q}$ terminal output simultaneously goes to a high level, thus initiating the charging signal S11 and changing the state of the control signal. The charging signal S11 activates the charging current source 52, which begins charging the capacitor 51, as shown in FIG. 4D. The lower-limit detection signal S14 terminates almost immediately, as shown in FIG. 4F.

The capacitor 51 continues to charge, until at a time $t=t_{13}$, the variable-level indicating signal $V_C$ reaches the upper reference voltage $V_H$, when the upper-limit detection signal S13 is again provided to condition the NAND circuit 61 to accept the next following input pulse S1.

The operation of the circuit proceeds as described above at the initiation of each input pulse S1. Another input pulse arrives at time $t=t_{21}$ and the same events occur at times $t=t_{21}$ through $t=t_{24}$ as occurred at $t_{11}$ through $t_{14}$, respectively, with the first input pulse S1. However, assume that a noise pulse SN arrives on the input line at a time $t=t_{22*}$, between $t_{22}$ and $t_{23}$. Because the upper-limit detection signal S13 is absent, the NAND circuit 61 output S15 will not drop to provide the setting signal to the flip-flop 55 and change the state of the control signal from the Q and $\overline{Q}$ terminals. Thus, the circuit is "masked" from noise on the input line from a time $t=t_{22}$ to $t=t_{23}$.

As shown in FIG. 4D, the capacitor 51 stops charging at $t_{13}$, at which point the upper-level detection signal S13 is initiated, as shown in FIG. 4E. The time period between $t_{13}$ and $t_{14}$ is a margin period provided by the circuit so that if the masking period (up to $t_{13}$) is prolonged because of variations in the time constant of the capacitor 51, termination of the masking period is assured before the receipt of the next-following input pulse S1.

Thus, the present invention provides a pulse width processing circuit in which the width of the output pulse is determined by the time required for a capacitor to be discharged by a discharging means from an upper reference potential to a lower reference potential and the masking period is determined by the time required for the capacitor first to discharge then to be recharged back to the upper reference potential by a charging means. Since both the charging and discharging of the capacitor are used to time the operation of the circuit, the duration of the output pulse can be more precisely determined.

FIG. 5 shows a circuit diagram of the pulse width processing circuit shown schematically in FIG. 3. Generally, similar references numbers in FIG. 5 refer to the same elements as those same reference numbers in FIG. 3.

The NAND circuit 61 comprises two transistors 67 and 68. The flip-flop 55 comprises a pair of transistors 69 and 70 connected as shown in FIG. 5. A pair of transistors 71 and 72 connected as a current mirror comprise the constant charging current source 52. A pair of transistors 73 and 74 having their emitters connected comprise the constant discharging current source 53. A constant current transistor 75 is connected between the current source 53 and ground.

A pnp transistor 76, the emitter of which is coupled to one end of the capacitor 51, comprises the upper limit detector 56. The base of the transistor 76 is maintained at the upper reference voltage $V_H+0.7$ volts. Another pnp transistor 77, the emitter of which is coupled to the same end of the capacitor 51, comprises the lower limit detector 58. The base of the transistor 77 is maintained at the lower reference voltage $V_L+0.7$ volts. A pair of transistors 78 and 79 arranged as a current mirror and connected to the collector of the transistor 77 transfer the lower-level detection signal S14 from the lower limit detector 58 to the flip-flop 55.

When the $\overline{Q}$ terminal of the flip-flop 55 is at its higher level, the charging signal S11 causes the capacitor 51 to be charged as described above in connection with FIG. 3. The charging signal S11 turns on the transistor 74, and a constant current flows in the transistors 72, 74 and 75. This current is transformed into the collector current of the transistor 71 forming a current mirror circuit together with the transistor 72, and this collector current becomes the charging current for the capacitor 51. Since the Q output from the switching circuit 55 is at its lower level, the transistor 73 is switched off.

The capacitor 51 is charged until the potential across it, or the indicating signal, $V_C$ across it reaches the upper reference voltage $V_H$. When the voltage $V_c$ reaches $V_H$ at a time $t_{13}$, the transistor 76 of the upper limit detector 56 is turned on. The collector output from the transistor 76 is supplied to the base of the transistor 68 of the NAND circuit 61 as the upper-level indicating signal S13, and the transistor 68 is turned on. The masking of the NAND circuit 61, by the absence of the upper-level detection signal S13, is terminated and an input pulse S1 received at the base of the transistor 67 will thus cause the NAND circuit 61 output S15 to go to its lower level.

When the input pulse S1 is received, the flip-flop 55 is inverted, and its Q terminal goes to its higher level. The resulting discharging signal S12 turns on the transistor 73 of the constant discharging current source 53. The termination of the charging signal S11 turns off the transistor 74. Accordingly, the charge on the capacitor 51 is discharged through the transistor 73 and the constant current transistor 75.

When the capacitor 51 starts discharging, the transistor 76 is immediately turned off. Therefore, the transistor 68 of the NAND circuit 61 is turned off, and noise on the input line is masked.

When the voltage $V_C$ across the capacitor 51 reaches the lower reference voltage $V_L$, the transistor 77 of the lower limit detector 58 is turned on. The lower-level detection signal S14 is thus supplied through the current mirror transistors 78 and 79 to invert the flip-flop 55. The $\overline{Q}$ terminal from the flip-flop 55 then goes to its higher level, and the capacitor 51 begins to charge again. The Q terminal goes to its lower level, thus terminating the output pulse.

In the embodiment described above, the output pulse is obtained utilizing the discharging time of the capacitor 51. However, the output pulse may be obtained utilizing the capacitor's charging time. In addition, the capacitor 51 is charged and discharged by the constant current sources 52 and 53, but other equivalent circuit configurations may be used.

The embodiment used to describe the present invention is particularly useful in image processing systems. However, the present invention is not limited to that application. It can also be applied to a wide variety of signal processing systems wherein output pulses having a predetermined pulse width are to be supplied in response to periodic input pulses.

In summary, according to the present invention, a pulse signal processing circuit supplies output pulses in response to periodic input pulses and prevents noise on the input line from providing spurious output pulses. In the present invention the entire range between the upper and lower limits of the potential across a capacitor is used to obtain an output pulse. Accordingly, the precision of the width of the detection pulse may be significantly improved over that of a conventional circuit. For example, in the conventional circuit shown in FIG. 1, a reference voltage which determines the width of the output pulse, is provided between upper and lower voltage limits of an input capacitor. Accordingly, with the conventional circuit, the voltage change that determines the output pulse width is limited to the narrow range from the lower limit voltage to the intermediate reference level because the remaining range, between the reference level and the upper limit voltages, is required for masking. However, in the pulse width processing circuit of the present invention, the full range between upper and lower reference voltages is used to determined the width of the output pulse, so that the pulse width can be set with increased precision.

The above detailed description is intended only to illustrate the present invention. Those skilled in the art will recognize that modifications other than those specifically pointed out can be made within departing from the spirit of the invention, and the scope of the present invention is defined solely by the claims which follow.

What is claimed is:

1. A pulse signal processing circuit comprising:
   an input for receiving an input pulse;
   control means for providing a control signal having a first state in response to said input pulse and a second state in response to a detection signal, said control means masking noise while in said second state in response to said detection signal;
   indicating means for providing a variable-level indicating signal in response to said control signal at said first state, said indicating means including a capacitor and said indicating signal comprising the potential across said capacitor, said indicating means further including charging means for charging said capacitor to an upper reference potential when activated and discharging means for discharging said capacitor to a lower reference potential when activated;
   detecting means for detecting the level of said indicating signal including a limit detector for providing said detection signal when the potential across said capacitor reaches a predetermined level equal to one of said reference potentials;

said control signal including a charging signal for activating said charging means and a discharging signal for activating said discharging means, and said control means including a switching circuit for providing said first state of said control signal constituted by one of said charging and discharging signals and for providing said second state of said control signal constituted by the other of said charging and discharging signals;

said switching circuit providing said first state of said control signal in response to an initiation of the input pulse and the second state of said control signal in response to said detection signal; and output means for providing an output pulse of a duration determined by the duration of said states of said control signal;

said switching circuit including flip-flop means for selectively providing said charging and discharging signals at output terminals thereof when said flip-flop means is set and reset;

said flip-flop means being set in response to an input pulse and reset in response to said detection signal; and said charging and discharging means being constituted by constant charging and discharging current sources, respectively; and wherein said detection means includes a lower limit detector for providing a lower-limit detection signal when said capacitor reaches said lower reference potential;

said flip-flop means provides said discharging signal when said flip-flop means is set and said charging signal when said flip-flop means is reset; and said discharging signal comprises an output pulse.

2. A pulse signal processing circuit comprising:

an input for receiving an input pulse;

control means for providing a control signal having a first state in response to said input pulse and a second state in response to a detection signal, said control means masking noise while in said second state in response to said detection signal;

indicating means for providing a variable-level indicating signal in response to said control signal at said first state, said indicating means including a capacitor and said indicating signal comprising the potential across said capacitor, said indicating means further including charging means for charging said capacitor to an upper reference potential when activated and discharging means for discharging said capacitor to a lower reference potential when activated;

detecting means for detecting the level of said indicating signal including a limit detector for providing said detection signal when the potential across said capacitor reaches a predetermined level equal to one of said reference potentials;

said control signal including a charging signal for activating said charging means and a discharging signal for activating said discharging means and said control means including a switching circuit for providing said first state of said control signal constituted by one of said charging and discharging signals and for providing said second state of said control signal constituted by the other of said charging and discharging signals;

said switching circuit providing said first state of said control signal in response to an initiation of the input pulse and the second state of said control signal in response to said detection signal; and output means for providing an output pulse of a duration determined by the duration of said states of said control signal; wherein:

said detection means includes an upper-limit detector for providing an upper-limit detection signal when said capacitor reaches said upper reference potential and a lower limit detector for providing a lower-limit detection signal when said capacitor reaches said lower reference potential;

said control means further includes gate means for accepting the input pulse at one input terminal thereof and one of said detection signals at another input terminal thereof and supplying an output for providing said control signal in one of said first and second states; and said switching circuit provides said other state of said control signal in response to the other of said detection signals.

3. A pulse signal processing circuit as in claim 2; wherein:

said gate means accepts said upper-limit detection signal; and said switching circuit accepts said lower-limit detection signal.

4. A pulse signal processing circuit as in claim 3; wherein:

said gate means comprises a NAND circuit having a first input for accepting said input pulse and a second input for accepting said upper-limit detection signal and providing an output in response to the presence of both said input pulse and said upper-limit detection signal;

said upper limit detector substantially prevents said potential across said capacitor from exceeding said upper reference potential;

said switching circuit includes a flip-flop having a set terminal for accepting the output of said NAND circuit, a reset terminal for accepting said lower-limit detection signal, a first output terminal for providing said charging signal when said flip-flop is reset and a second output terminal for providing said discharging signal when said flip-flop is set; and said discharging signal constitutes said output pulse.

5. A pulse signal processing circuit as in claim 4; wherein the absence of said upper-limit detection signal serves as a masking signal for preventing setting of said flip-flop while the potential across said capacitor is lower than said upper reference potential, said masking signal being slightly shorter in duration than the time between input pulses for providing a margin period between the termination of said masking signal and the initiation of an input pulse.

6. A video image processing system comprising:

gate means for accepting periodic input pulses and a first detection signal and providing a setting signal in response to the presence of both, said gage means masking noise in said periodic input pulses in response to said first detection signal;

a switching circuit for selectively providing charging and discharging signals in response to said setting signal and a second detection signal, one of said charging and discharging signals constituting an output pulse;

a capacitor for providing a variable-level indicating signal from the potential across said capacitor;

charging means for increasing the potential across said capacitor in response to said charging signal;

discharging means for decreasing the potential across said capacitor in response to said discharging signal; and detecting means for providing said first and second detection signals when the potential across said capacitor reaches predetermined reference potentials, whereby the duration of the output pulse is determined by the time required for the potential of said capacitor to reach one reference potentials from the other.

7. A video image processing system as in claim 6; wherein:

said gate means includes a NAND circuit for providing said setting signal when both an input pulse and said first detection signal are received;

said switching circuit comprises a flip-flop having a set terminal for receiving said setting signal from said NAND circuit, a reset terminal for receiving said second detection signal, a first output terminal for providing said charging signal when said flip-flop is reset and a second output terminal for providing said discharging signal when said flip-flop is set, whereby said discharging signal constitutes the output pulse;

said charging and discharging means respectively includes constant charging and discharging current sources activated by said charging and discharging signals, respectively; and said detecting means includes an upper limit detector for providing said first detection signal when the potential across said capacitor reaches an upper reference potential and a lower limit detector for providing said second detection signal when the potential across said capacitor reaches a lower reference potential, whereby said first detection signal serves as a masking signal for preventing setting of said flip-flop in the absence of said first detection signal.

8. A video image processing system as in claim 7; wherein the duration of said masking signal is slightly shorter than the time between input pulses for providing a margin period between the termination of said masking signal and the initiation of the next input pulse.

* * * * *